(12) United States Patent
Shimogawara et al.

(10) Patent No.: US 10,964,920 B2
(45) Date of Patent: Mar. 30, 2021

(54) METHOD FOR PRODUCING ORGANIC ELECTRONIC DEVICE

(71) Applicant: SUMITOMO CHEMICAL COMPANY, LIMITED, Tokyo (JP)

(72) Inventors: Masaya Shimogawara, Niihama (JP); Shinichi Morishima, Tsukuba (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 16/613,722

(22) PCT Filed: Apr. 24, 2018

(86) PCT No.: PCT/JP2018/016642
§ 371 (c)(1),
(2) Date: Nov. 14, 2019

(87) PCT Pub. No.: WO2018/211924
PCT Pub. Date: Nov. 22, 2018

(65) Prior Publication Data
US 2020/0075902 A1     Mar. 5, 2020

(30) Foreign Application Priority Data
May 17, 2017   (JP) .............................. JP2017-098301

(51) Int. Cl.
*H01L 51/56*     (2006.01)
*H01L 51/52*     (2006.01)
*H01L 51/00*     (2006.01)

(52) U.S. Cl.
CPC .......... *H01L 51/56* (2013.01); *H01L 51/0029* (2013.01); *H01L 51/5253* (2013.01)

(58) Field of Classification Search
CPC . H01L 51/0029; H01L 51/5253; H01L 51/56; H05B 33/04; H05B 33/10
See application file for complete search history.

(56) References Cited

U.S. PATENT DOCUMENTS

2017/0100926 A1*  4/2017  Kano .................... H01L 51/50

FOREIGN PATENT DOCUMENTS

| EP | 2563096 A1 | 2/2013 |
| JP | 62-46625 A | 2/1987 |

(Continued)

OTHER PUBLICATIONS

International Preliminary Report on Patentability, dated Nov. 28, 2019 and English translation of the Written Opinion of the International Searching Authority, dated Jul. 24, 2018, for International Application No. PCT/JP2018/016642.

(Continued)

*Primary Examiner* — Daniel P Shook
(74) *Attorney, Agent, or Firm* — Birch, Stewart, Kolasch & Birch, LLP (57) ABSTRACT

A method for producing an organic electronic device according to an embodiment includes: a device base formation step; a dehydration step of dehydrating a protective film-bearing sealing member under a pressure of 1000 Pa or more while conveying the protective film-bearing sealing member 10 in which a protective film 30 is laminated on a sealing member 20; and a sealing member bonding step of peeling off the protective film 30 from the protective film-bearing sealing member which has been subjected to the dehydration step and bonding the sealing member 20 to a device base. In the dehydration step, an atmosphere gas G1 having a dew point of −40° C. or lower is caused to flow from a downstream side to an upstream side in a conveyance direction of the protective film-bearing sealing member.

6 Claims, 5 Drawing Sheets

(56) References Cited

FOREIGN PATENT DOCUMENTS

| JP | 2003-113317 A | 4/2003 |
| JP | 2015-125875 A | 7/2015 |
| WO | WO 2011/052630 A1 | 5/2011 |
| WO | WO 2011/058888 A1 | 5/2011 |
| WO | WO 2015/198991 A1 | 12/2015 |
| WO | WO 2016/152756 A1 | 9/2016 |

OTHER PUBLICATIONS

International Search Report, dated Jul. 24, 2018, for International Application No. PCT/JP2018/016642.
Extended European Search Report, dated Jan. 13, 2021, for European Application No. 18801639.8.

* cited by examiner

METHOD FOR PRODUCING ORGANIC ELECTRONIC DEVICE

TECHNICAL FIELD

The present invention relates to a method for producing an organic electronic device.

BACKGROUND ART

An organic electronic device includes: a device base on which a first electrode, a device functional portion (including an organic layer), and a second electrode are provided on a substrate in this order; and a sealing member that seals the device functional portion. As the sealing member, for example, a technique in which an adhesive layer (resin composition layer) is laminated on a sealing base (support) as described in Patent Literature 1 is known. Such a sealing member is bonded to a device base via the adhesive layer. In the technique described in Patent Literature 1, a protective film (cover film) is provided on the adhesive layer of the sealing member until the sealing member is bonded to the device base. Since the sealing member is configured to prevent an organic layer of a device functional portion from deteriorating due to moisture, it is preferable that the sealing member itself be also dehydrated.

CITATION LIST

Patent Literature

Patent Literature 1: PCT International Application Publication No. 2016/152756

SUMMARY OF INVENTION

Technical Problem

In Patent Literature 1, it is disclosed that the sealing member provided with the protective film (protective film-bearing sealing member) is dehydrated using infrared rays and ambient atmosphere of the protective film-bearing sealing member in the middle of being dehydrated is set to a predetermined dew point. However, when the protective film-bearing sealing member is dehydrated, moisture is discharged from the protective film-bearing sealing member, and thus, the dew point of the ambient atmosphere of the protective film-bearing sealing member deteriorates from the above-described predetermined dew point so that there is a risk that the moisture is less likely to be released from the protective film-bearing sealing member. Thus, there is a risk that it is difficult to sufficiently dehydrate the protective film-bearing sealing member. When the protective film-bearing sealing member is dehydrated, there is a case where deformation of the protective film-bearing sealing member is caused, for example, due to air bubbles generated due to the moisture release from the adhesive layer.

Therefore, the present invention aims to provide a method for producing an organic electronic device capable of suppressing deformation of a protective film-bearing sealing member caused by an air bubble and capable of more reliably dehydrating the protective film-bearing sealing member in a dehydration step of the protective film-bearing sealing member.

Solution to Problem

A method for producing an organic electronic device according to one aspect of the present invention includes: a device base formation step of forming a device base in which a first electrode, a device functional portion including an organic layer, and a second electrode are sequentially provided on a substrate; a dehydration step of dehydrating a protective film-bearing sealing member under a pressure of 1000 Pa or more while conveying the protective film-bearing sealing member, in which a protective film is laminated via an adhesive layer on a sealing member, in which the adhesive layer is laminated on a sealing base; and a sealing member bonding step of peeling off the protective film from the protective film-bearing sealing member which has been subjected to the dehydration step and bonding the sealing member to the device base via the adhesive layer. In the dehydration step, an atmosphere gas having a dew point of −40° C. or lower is caused to flow from a downstream side to an upstream side in a conveyance direction of the protective film-bearing sealing member.

In the dehydration step, the atmosphere gas having the dew point of −40° C. or lower is caused to flow from the downstream side to the upstream side in the conveyance direction of the protective film-bearing sealing member. If dehydration is performed while conveying the protective film-bearing sealing member, moisture is released as the protective film-bearing sealing member is conveyed, and thus, a moisture content of the protective film-bearing sealing member is lower on the downstream side. Thus, if the atmosphere gas with the dew point of −40° C. or lower is caused to flow from the downstream side to the upstream side, the atmospheric gas, which is not affected by the moisture released from the protective film-bearing sealing member, flows around the protective film-bearing sealing member having a low moisture content. As a result, it is possible to dehydrate the protective film-bearing sealing member while reducing the influence of the moisture released from the protective film-bearing sealing member, and it is possible to efficiently obtain the protective film-bearing sealing member having a desired moisture content in the dehydration step. Since the atmosphere gas having the dew point of −40° C. or lower is caused to flow from the downstream side to the upstream side, it is possible to suppress the fluctuation of the dew point of the atmosphere around the protective film-bearing sealing member and to maintain a constant dew point. Furthermore, since the dehydration step is performed under the pressure of 1000 Pa or more, an air bubble is not formed when moisture in the protective film-bearing sealing member is released, and it is also possible to suppress deformation of the protective film-bearing sealing member caused by the air bubble.

A dew point of ambient atmosphere of the protective film-bearing sealing member, which has been subjected to the dehydration step, between a start of the dehydration step and an end of the sealing member bonding step is preferably −40° C. or lower.

Since the ambient atmosphere of the sealing member, which has been subjected to the dehydration step, between the start of the dehydration step and the end of the sealing member bonding step is set to the dew point of −40° C. or lower, it is possible to bond the sealing member substantially held in a dehydrated state (a moisture content and the like) in the dehydration step to the device base.

A method for producing an organic electronic device according to one embodiment may include a winding step of conveying the protective film-bearing sealing member toward a winding unit after the dehydration step and winding the protective film-bearing sealing member at the winding unit. In the winding step, an atmosphere gas having a dew point of −40° C. or lower may be caused to flow from the downstream side to the upstream side in the conveyance direction of the protective film-bearing sealing member.

In the dehydration step, the protective film-bearing sealing member may be dehydrated in a heating chamber. In the winding step, the protective film-bearing sealing member may be wound in a winding chamber with atmosphere having a dew point of −40° C. or lower, the winding chamber provided at a subsequent stage of the heating chamber.

Advantageous Effects of Invention

According to the present invention, it is possible to provide the method for producing the organic electronic device capable of suppressing deformation of the protective film-bearing sealing member caused by the air bubble and capable of more reliably dehydrating the protective film-bearing sealing member in the dehydration step of the protective film-bearing sealing member.

DESCRIPTION OF EMBODIMENTS

Hereinafter, an embodiment of the present invention will be described with reference to the drawings. The same elements will be denoted by the same reference signs, and redundant descriptions thereof will be omitted. Dimensional ratios of the drawings do not always coincide with those of the description.

Figure 1:
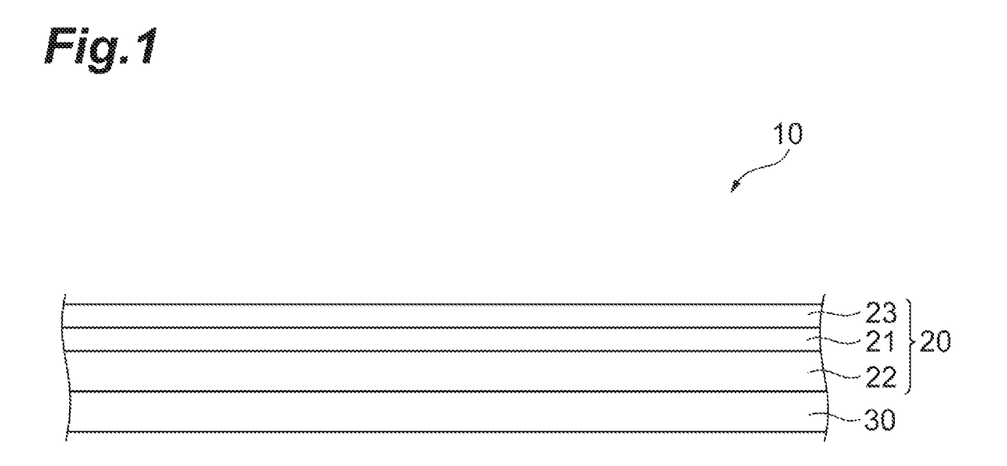
FIG. 1 is a side view of a protective film-bearing sealing member according to an embodiment.

FIG. 1 is a side view of a protective film-bearing sealing member 10 used for producing an organic electronic device (organic EL device) according to an embodiment. FIG. 1 schematically illustrates a configuration of the protective film-bearing sealing member 10. The protective film-bearing sealing member 10 includes a sealing member 20 and a protective film 30. The protective film-bearing sealing member 10 may have a strip shape or a sheet shape. Hereinafter, the protective film-bearing sealing member 10 has a strip shape unless otherwise indicated.

The sealing member 20 is a member to prevent deterioration of an organic layer included in the organic EL device. The sealing member 20 has a sealing base 21, an adhesive layer 22, and a resin film 23.

The sealing base 21 has a moisture barrier function. An example of a moisture permeation rate of the sealing base 21 is $5 \times 10^{-5}$ g/(m²·24 hr) or less under an environment of a temperature of 40° C. and a humidity of 90% RH. The sealing base 21 may have a gas barrier function. Examples of the sealing base 21 are a metal foil, a barrier film having a barrier functional layer formed on one surface or both surfaces of a transparent plastic film, a thin film glass having flexibility, a film in which metal having a barrier property is laminated on a plastic film, and the like. An example of a thickness of the sealing base 21 is 10 µm to 300 µm. As the metal foil, a copper foil, an aluminum foil, or a stainless steel foil is preferable from the viewpoint of a barrier property. When the sealing base 21 is a metal foil, a thickness of the metal foil is preferably as large as possible from the viewpoint of suppressing a pinhole, and is preferably 10 µm to 50 µm from the viewpoint of flexibility.

The adhesive layer 22 is laminated on one surface of the sealing base 21. The adhesive layer 22 is a layer disposed to attach at least two adjacent layers to each other. The adhesive layer 22 may have a thickness capable of embedding a portion that needs to be sealed by the sealing member 20 in the organic EL device. An example of the thickness of the adhesive layer 22 is 5 µm to 100 µm.

Examples of a material of the adhesive layer 22 include a photocurable or thermosetting acrylate resin, a photocurable or thermosetting epoxy resin, and the like. Other resin films which can be bonded by a generally used impulse sealer, for example, a thermo-adhesive film such as an ethylene vinyl acetate copolymer (EVA), a polypropylene (PP) film, a polyethylene (PE) film, and a polybutadiene film, can be used as the adhesive layer 22. A thermoplastic resin can also be used for the material of the adhesive layer 22, and examples thereof include an olefin-based elastomer, a styrene-based elastomer, and a butadiene-based elastomer.

The adhesive layer 22 may include a moisture absorbent. The moisture absorbent is an agent that absorbs moisture, but may absorb oxygen and the like in addition to moisture. A moisture absorption rate of the moisture absorbent is preferably 1 wt %/hr or higher under an environment of a temperature of 24° C. and a humidity of 55% RH.

The resin film 23 is laminated on the other surface (surface opposite to the surface in contact with the adhesive layer 22) of the sealing base 21. Examples of a material of the resin film 23 include polyethylene terephthalate (PET) and polyimide (PI). Although the sealing member 20 provided with the resin film 23 is illustrated in FIG. 1, the resin film 23 is not necessarily provided if the sealing member 20 includes the sealing base 21 and the adhesive layer 22.

The protective film 30 is laminated on a surface of the adhesive layer 22 opposite to a surface in contact with the sealing base 21. That is, the protective film 30 is laminated on the sealing member 20 via the adhesive layer 22. The protective film 30 is a member to prevent dust from adhering to the adhesive layer 22 and prevent the adhesive layer 22 from adhering to a conveyance roller R, which will be described later, until the organic EL device is produced. The protective film 30 may be a peelable film that can be peeled off from the adhesive layer 22.

Examples of a material of the protective film 30 include polyethylene naphthalate (PEN), PET, PP, PE, PI, a cycloolefin polymer, a cycloolefin copolymer, and the like. Examples of a thickness of the protective film 30 include 9 µm to 50 µm.

A coating layer may be formed on a surface of the protective film 30 in contact with the adhesive layer 22. Examples of a material of the coating layer are a silicone resin-based release agent, a fluorine-based release agent, an alkyd-based release agent, an acrylic-based release agent, and the like.

Figure 2:
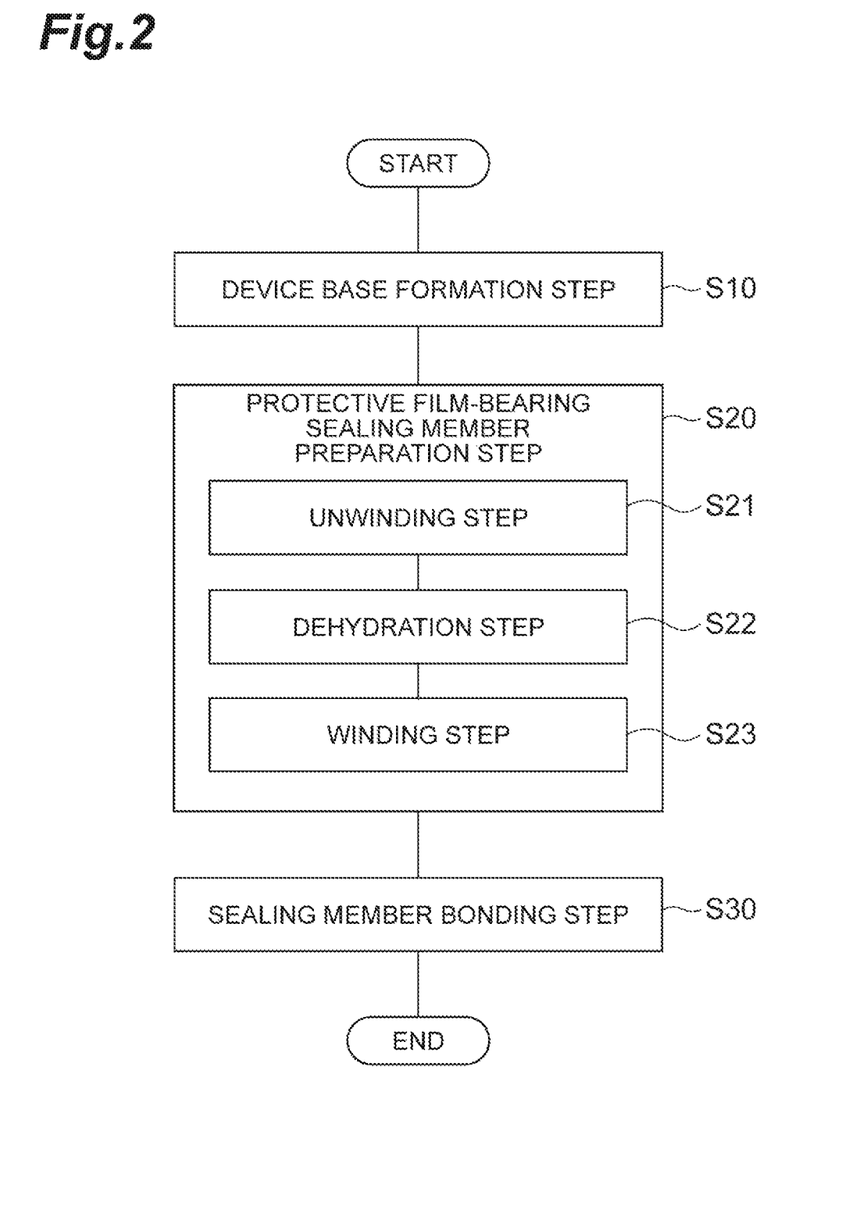
FIG. 2 is a flowchart illustrating a method for producing an organic electronic device (organic EL device) using the protective film-bearing sealing member illustrated in FIG. 1.

Next, an example of a method for producing the organic EL device using the protective film-bearing sealing member 10 illustrated in FIG. I will be described. As illustrated in FIG. 2, the method for producing the organic EL device includes a device base formation step S10, a preparation step S20 of the protective film-bearing sealing member 10, and a sealing member bonding step S30. Unless otherwise indicated, a case where the organic EL device that needs to be produced is a bottom emission type will be described, but the organic EL device may be a top emission type.

[Device Base Formation Step]

Figure 3:
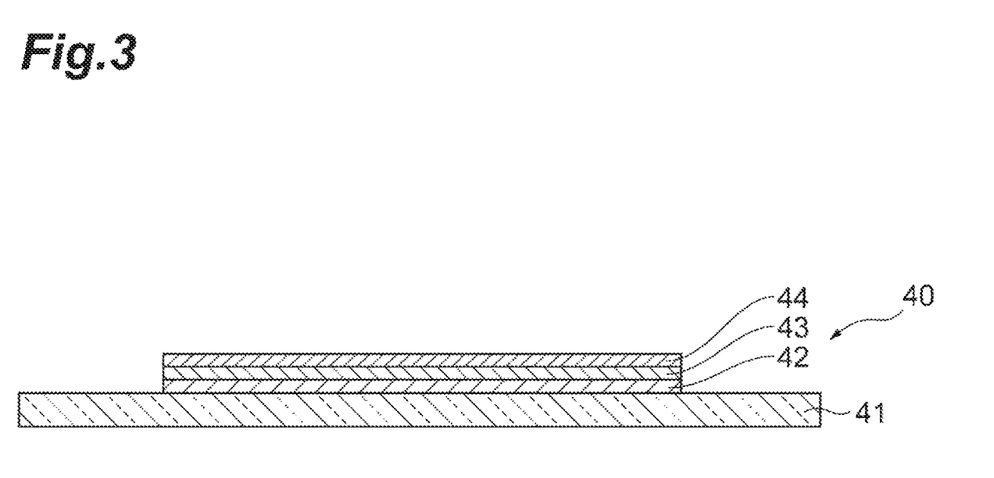
FIG. 3 is a cross-sectional view illustrating an example of a configuration of a device base provided in the organic EL device that needs to be produced.

In the device base formation step S10, the device base 40 is formed by sequentially laminating an anode (first electrode) 42, an organic EL portion (device functional portion including an organic layer) 43, and a cathode (second electrode) 44 on a substrate 41 as illustrated in FIG. 3. The device base 40 will be described.

[Substrate]

The substrate 41 has a light transmitting property with respect to light (including visible light with a wavelength of 400 nm to 800 nm) emitted by the organic EL device to be produced. In the present embodiment, the substrate 41 used for producing the organic EL device has a strip shape. An example of a thickness of the substrate 41 is 30 μm to 700 μm.

As the substrate 41, a substrate having flexibility is preferable. The flexibility is a property that enables the substrate to be bent without shearing or breaking even when a predetermined force is applied to the substrate. An example of the substrate 41 is a plastic film or a polymer film. The substrate 41 may further have a barrier layer having a moisture barrier function. The barrier layer may have a function of blocking a gas (for example, oxygen) in addition to the function of blocking moisture.

[Anode]

The anode 42 is provided on the substrate 41. An electrode exhibiting light transparency is used for the anode 42. A thin film, such as metal oxide, metal sulfide and metal having high electric conductivity, can be used as the electrode exhibiting light transparency, and a thin film having high light transmittance is suitably used. The anode 42 may have a network structure made of a conductor (for example, metal). A thickness of the anode 42 can be determined in consideration of light transparency, electric conductivity, and the like. The thickness of the anode 42 is generally 10 nm to 10 μm, preferably 20 nm to 1 μm, and more preferably 50 nm to 500 nm.

Examples of a material of the anode 42 include indium oxide, zinc oxide, tin oxide, indium tin oxide (abbreviated as ITO), indium zinc oxide (indium zinc oxide: abbreviated as IZO), gold, platinum, silver, copper, and the like. Among these, ITO, IZO, or tin oxide is preferable. The anode 42 can be formed as a thin film made of the exemplified material. As a material of the anode 42, an organic substance such as polyaniline and a derivative thereof; polythiophene and a derivative thereof may be used. In this case, the anode 42 can be formed as a transparent conductive film.

The anode 42 can be formed by a dry film formation method, a plating method, a coating method, or the like. Examples of the dry film formation method include a vacuum vapor deposition method, a sputtering method, an ion plating method, a CVD method, and the like. Examples of the coating method include an inkjet printing method, a slit coating method, a micro-gravure coating method, a gravure coating method, a bar coating method, a roll coating method, a wire bar coating method, a spray coating method, a screen printing method, a flexographic printing method, an offset printing method, and a nozzle printing method, and the like. Among these, the inkjet printing method is preferable.

[Organic EL Portion]

The organic EL portion 43 is a functional unit that contributes to light emission of the organic EL device, such as charge transfer and charge recombination, in accordance with a voltage applied to the anode 42 and the cathode 44. The organic EL portion 43 has an organic layer such as a light-emitting layer.

The light-emitting layer is a functional layer having a function of emitting light (including visible light). The light-emitting layer is generally configured using an organic substance that mainly emits at least one of fluorescence and phosphorescence, or the organic substance and a dopant material that assists the organic substance. Thus, the light-emitting layer is the organic layer. The dopant material is added in order to, for example, improve light emission efficiency or changing a light emission wavelength. The organic substance may be either a low molecular weight compound or a high molecular weight compound. A thickness of the light-emitting layer is, for example, about 2 nm to 200 nm.

Examples of the organic substance, which mainly emits at least one of fluorescence and phosphorescence, include the following dye-based material, metal complex-based material, and polymer-based material.

(Dye-Based Material)

Examples of the dye-based material include a cyclopentamine derivative, a tetraphenylbutadiene derivative compound, a triphenylamine derivative, an oxadiazole derivative, a pyrazoloquinoline derivative, a distyrylbenzene derivative, a distyrylarylene derivative, a pyrrole derivative, a thiophene ring compound, a pyridine ring compound, a perinone derivative, a perylene derivative, an oligothiophene derivative, an oxadiazole dimer, a pyrazoline dimer, a quinacridone derivative, a coumarin derivative, and the like.

(Metal Complex-Based Material)

Examples of the metal complex-based material include a metal complex having rare earth metal such as Tb, Eu, and Dy, or Al, Zn, Be, Ir, Pt, or the like as center metal and having oxadiazole, thiadiazole, phenyl pyridine, phenyl benzimidazole, a quinolone structure, or the like as a ligand. Examples of the metal complex include a metal complex emitting light in a triplet excited state such as an iridium complex and a platinum complex, an aluminum quinolinol complex, a benzoquinolinol beryllium complex, a benzoxazolyl zinc complex, a benzothiazole zinc complex, an azomethyl zinc complex, a porphyrine zinc complex, and a phenanthroline europium complex, and the like.

(Polymer-Based Material)

Examples of the polymer-based material include a polyparaphenylenevinylene derivative, a polythiophene derivative, a polyparaphenylene derivative, a polysilane derivative, a polyacetylene derivative, a polyfluorene derivative, a polyvinyl carbazole derivative, a material in which the dye-based material and the metal complex-based light-emitting material are polymerized, and the like.

(Dopant Material)

Examples of the dopant material include a perylene derivative, a coumarin derivative, a rubrene derivative, a quinacridone derivative, a squalium derivative, a porphyrin derivative, a styryl-based dye, a tetracene derivative, a pyrazolone derivative, decacyclene, phenoxazone, and the like.

The light-emitting layer can be formed by a dry film formation method, a coating method, or the like. Examples of the dry film formation method and the coating method are the same as those in the case of the anode 42. The light-emitting layer is preferably formed by an inkjet printing method.

The organic EL portion 43 may have various functional layers in addition to the light-emitting layer. Examples of the functional layer disposed between the anode 42 and the light-emitting layer are a hole injection layer, a hole transport layer, and the like. Examples of the functional layer disposed between the cathode 44 and the light-emitting layer are an electron injection layer, an electron transport layer, and the like. The electron injection layer may be a part of the cathode 44. These functional layers may be organic layers containing organic substances.

Examples of a layer configuration of the organic EL portion 43 will be described hereinafter. In the following examples of the layer configuration, the anode and the cathode are also described in parentheses in order to illustrate an arrangement relationship among the anode 42, the cathode 44 and various functional layers.

(a) (anode)/light-emitting layer/(cathode)
(b) (anode)/hole injection layer/light-emitting layer/(cathode)
(c) (anode)/hole injection layer/light-emitting layer/electron injection layer/(cathode)
(d) (anode)/hole injection layer/light-emitting layer/electron transport layer/electron injection layer/(cathode)
(e) (anode)/hole injection layer/hole transport layer/light-emitting layer/(cathode)
(f) (anode)/hole injection layer/hole transport layer/light-emitting layer/electron injection layer/(cathode)
(g) (anode)/hole injection layer/hole transport layer/light-emitting layer/electron transport layer/electron injection layer/(cathode)
(h) (anode)/light-emitting layer/electron injection layer/(cathode)
(i) (anode)/light-emitting layer/electron transport layer/electron injection layer/(cathode)

A symbol "/" means that layers on both sides of the symbol "/" are bonded to each other.

The hole injection layer is a functional layer having a function of improving hole injection efficiency from the anode to the light-emitting layer. The hole transport layer is a functional layer having a function of improving hole injection efficiency to the light-emitting layer from the anode, the hole injection layer, or a portion of the hole transport layer which is closer to the anode. The electron transport layer is a functional layer having a function of improving electron injection efficiency to the light-emitting layer from the cathode, the electron injection layer, or a portion of the electron transport layer which is closer to the cathode. The electron injection layer is a functional layer having a function of improving electron injection efficiency from the cathode to the light-emitting layer.

A known material can be used as a material of the functional layers (for example, the hole injection layer, the hole transport layer, the electron injection layer, the electron transport layer, and the like) other than the light-emitting layer provided in the organic EL portion 43. An optimum value of the thickness of the functional layer of the organic EL portion 43 varies depending on the material to be used, and is set in consideration of electrical conductivity, durability, and the like. The functional layers other than the light-emitting layer of the organic EL portion 43 can be formed using the same method as the light-emitting layer.

[Cathode]

The cathode 44 is provided on the organic EL portion 43. An optimum value of a thickness of the cathode 44 varies depending on the material to be used, and is set in consideration of electrical conductivity, durability, and the like. The thickness of the cathode 44 is, for example, 10 nm to 10 μm, preferably 20 nm to 1 μm, and more preferably 50 nm to 500 nm.

The material of the cathode 44 is preferably a material having a high reflectance with respect to light from the light-emitting layer of the organic EL portion 43 (particularly visible light) such that light from the organic EL portion 43 (specifically, light from the light-emitting layer) is reflected by the cathode 44 and proceeds toward the anode 42. Examples of the material of the cathode 44 include alkali metal, alkaline earth metal, transition metal, a group 13 metal in the periodic table, and the like. A transparent conductive electrode made of a conductive metal oxide, a conductive organic material, or the like may be used as the cathode 44.

Examples of a method for forming the cathode 44 include a coating method such as an inkjet method, a slit coater method, a gravure printing method, a screen printing method, and a spray coater method, a vacuum vapor deposition method, a sputtering method, a lamination method which thermally compressing and bonding a metal thin film, and the like.

In the device base formation step S10, the device base 40 is formed by sequentially laminating the anode 42, the organic EL portion 43, and the cathode 44 on a plurality of device formation areas virtually set on the substrate 41 while conveying the strip-like substrate 41 in a longitudinal direction using a roll-to-roll system. The anode 42, the organic EL portion 43, and the cathode 44 can be formed by the above-described method. When the organic EL portion 43 has a multi-layer structure, the respective layers may be formed in order from the anode 42 side.

[Preparation Step of Protective Film-Bearing Sealing Member]

In the preparation step S20 of the protective film-bearing sealing member 10 (hereafter referred to as the preparation step S20), the protective film-bearing sealing member 10 is dehydrated using the roll-to-roll system. As illustrated in FIG. 2, the preparation step S20 includes an unwinding step S21, a dehydration step S22, and a winding step S23.

Figure 4:
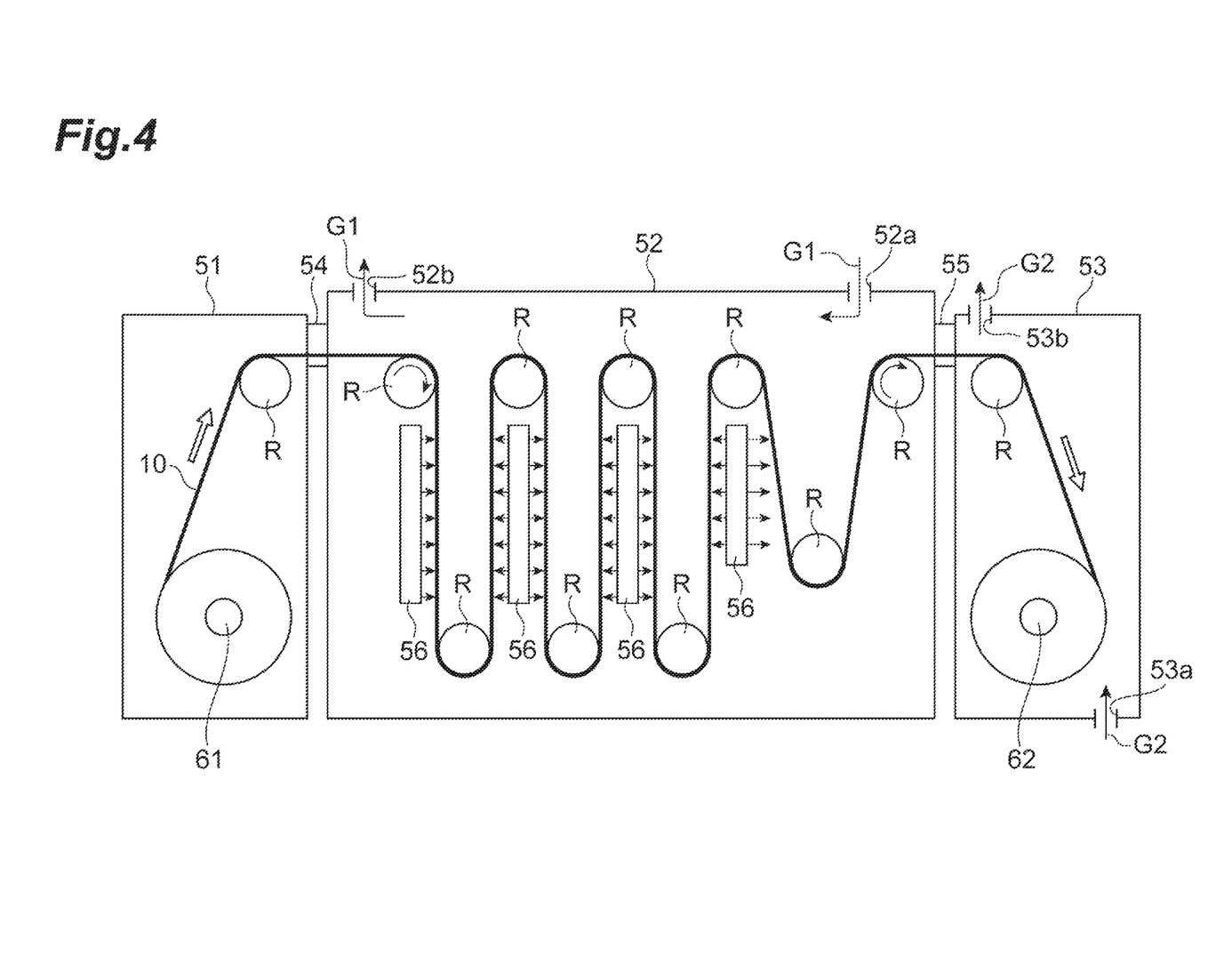
FIG. 4 is a drawing for describing a preparation step illustrated in FIG. 2.

FIG. 4 is a drawing for describing the preparation step S20 of the protective film-bearing sealing member. In FIG. 4, the protective film-bearing sealing member 10 is schematically illustrated by a thick solid line. In the preparation step S20, dehydration is performed while conveying the protective film-bearing sealing member 10 by the conveyance roller R in the longitudinal direction thereof. In the present embodiment, the protective film-bearing sealing member 10 is conveyed such that the protective film 30 is in contact with the conveyance roller R, but the resin film 23 may be in contact with the conveyance roller R.

(Unwinding Step)

In the unwinding step S21, the rolled-up protective film-bearing sealing member 10 is set to an unwinding unit 61 disposed in an unwinding chamber 51, and then, the protective film-bearing sealing member 10 is unwound, as illustrated in FIG. 4 The protective film-bearing sealing member 10 that has been unwound is conveyed to a heating chamber 52 by the conveyance roller R. The unwinding chamber 51 and the heating chamber 52 may be connected by a connecting portion 54 or may be directly connected.

(Dehydration Step)

In the dehydration step S22, the protective film-bearing sealing member 10 conveyed from the unwinding chamber 51 is dehydrated by heating (heated and dehydrated) with infrared rays while being conveyed by the conveyance roller R. Specifically, the protective film-bearing sealing member 10 is irradiated with the infrared rays from an infrared irradiation unit 56 disposed on a conveyance path of the protective film-bearing sealing member 10 to heat and dehydrate the protective film-bearing sealing member 10.

The infrared irradiation unit 56 may have a configuration capable of outputting the infrared rays to be used for heating and dehydration. An example of the infrared irradiation unit 56 is an infrared heater. The infrared irradiation unit 56 may be disposed with respect to the protective film-bearing sealing member 10, for example, so as to irradiate the protective film-bearing sealing member 10 with the infrared rays from the protective film 30 side.

The infrared ray to be emitted to the protective film-bearing sealing member 10 is preferably a mid-infrared ray (having a wavelength of 1.8 μm to 3.0 μm) including an absorption wavelength of water in order to efficiently heat and dehydrate the protective film-bearing sealing member 10. A heating temperature (surface temperature of the protective film-bearing sealing member 10) and a heating time during the dehydration step S22 are adjusted in accordance with a member used in the protective film-bearing sealing member 10.

In the dehydration step S22, the heating and dehydration of the protective film-bearing sealing member 10 is performed in the heating chamber 52 under a pressure of 1000 Pa or more.

Furthermore, in the dehydration step S22, an atmosphere gas G1 is caused to flow from the downstream side (a winding unit 62 side in the configuration of FIG. 4) to the upstream side (the unwinding unit 61 side in the configuration of FIG. 4) in a conveyance direction of the protective film-bearing sealing member 10. This can be realized by providing an air supply port 52a for the atmosphere gas G1 on the side of the winding chamber 53, which will be described later, and an exhaust port 52b for the atmosphere gas G1 on the unwinding chamber 51 side in the heating chamber 52, for example, as illustrated in FIG. 4. The atmosphere gas G1 is a gas configured to create an atmosphere (environment) in which the dehydration step S22 is performed. Examples of the atmosphere gas G1 include dry air, nitrogen, and argon.

(Winding Step)

In the winding step S23, the protective film-bearing sealing member 10 heated and dehydrated in the heating chamber 52 is rolled up by the winding unit 62 in the winding chamber 53 provided at the subsequent stage of the heating chamber 52. In the winding chamber 53, the protective film-bearing sealing member 10 that has been conveyed from the heating chamber 52 is conveyed by the conveyance roller R toward the winding unit 62. The heating chamber 52 and the winding chamber 53 may be connected by a connecting portion 55 or may be directly connected.

In one embodiment, the winding step S23 is performed by adjusting a dew point of ambient atmosphere of the protective film-bearing sealing member 10 to −40° C. or lower. The ambient atmosphere of the protective film-bearing sealing member 10 preferably has a dew point of −70° C. or lower. For example, the winding step S23 may be performed while causing an atmosphere gas G2 having a dew point −40° C. or lower (preferably having a dew point of −70° C. or lower) to flow from the downstream side (the winding unit 62 side) to the upstream side (side opposite to the winding unit 62 in the conveyance direction) in the conveyance direction of the protective film-bearing sealing member 10. Such flow of the atmosphere gas G2 can be realized by, for example, providing an air supply port 53a of the atmosphere gas G2 on the winding unit 62 side in the winding chamber 53 and providing an exhaust port 53b on an inlet side of the protective film-bearing sealing member 10 from the heating chamber 52. Examples of the atmosphere gas G2 are the same as those of the atmosphere gas G1. The atmosphere gases G1 and G2 can be the same gas.

The winding step S23 is preferably performed under a higher pressure condition than the dehydration step S22, that is, under a pressure exceeding 1000 Pa.

After the winding step S23, the protective film-bearing sealing member 10 is transported to an implementation place of the next sealing member bonding step S30, specifically, to an unwinding chamber in which an unwinding unit of the protective film-bearing sealing member 10 configured to perform the sealing member bonding step S30 is disposed, while keeping the rolled up protective film-bearing sealing member 10 under an atmosphere of a dew point of −40° C. or lower, preferably a dew point of −70° C. or lower. For example, the rolled-up protective film-bearing sealing member 10 may be accommodated in a sealed container in which the atmosphere is maintained, and the sealed container may be conveyed to the implementation place of the sealing member bonding step S30. Therefore, a transport step (or a storage step) of transporting the protective film-bearing sealing member 10 in the state of being stored under the atmosphere of the dew point −40° C. or lower, preferably the dew point −70° C. or lower can be provided between the winding step S23 and the sealing member bonding step S30 in the method for producing the organic EL device.

[Sealing Member Bonding Step]

Figure 5:
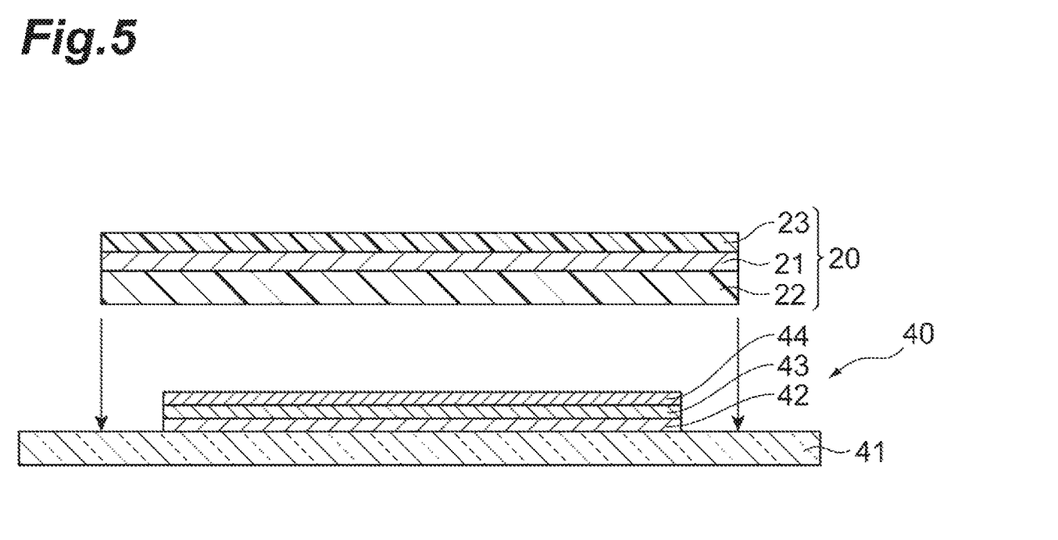
FIG. 5 is a drawing for describing a sealing member bonding step in the method for producing the organic electronic device (organic EL device).

In the sealing member bonding step S30, the protective film 30 is peeled off from the protective film-bearing sealing member 10, which has been subjected to the dehydration step S22, and an organic EL device is obtained by bonding the sealing member 20 to the device base 40 via the adhesive layer 22 as illustrated in FIG. 5. The sealing member bonding step S30 can be performed using a roll-to-roll system while conveying each of the protective film-bearing sealing member 10 and the device base 40 in the longitudinal direction.

Specifically, the heat dehydrated protective film-bearing sealing member 10 that has been rolled up is set to the unwinding unit disposed in the unwinding chamber of the protective film-bearing sealing member 10 for the sealing member bonding step S30. The unwinding chamber preferably has a dew point of −40° C. or lower, more preferably a dew point of −70° C. or lower. Thereafter, the protective film-bearing sealing member 10 is unwound, and the protective film 30 is peeled off from the protective film-bearing sealing member 10 continuously while being conveyed in the longitudinal direction.

Then, the sealing member 20, obtained by peeling off the protective film 30 from the protective film-bearing sealing member 10, is continuously bonded to the device base 40 being conveyed in the longitudinal direction while conveying the sealing member 20 in the longitudinal direction. Specifically, the sealing member 20 is bonded to the device base 40 by pressing and heating the sealing member 20 and the device base 40 in a thickness direction in a state where the adhesive layer 22 of the sealing member 20 is set to oppose the device base 40 as illustrated in FIG. 5, for example.

The device base 40 conveyed in the longitudinal direction may be the device base 40 that has been continuously conveyed after forming the cathode 44 in the device base formation step S10 or may be the device base 40 that has been unwound after setting the device base 40, once rolled up after forming the cathode 44, to the unwinding unit 61 for the device base 40.

The sealing member bonding step S30 is preferably performed under a condition that the dew point of the ambient atmosphere of the protective film-bearing sealing member 10 is −40° C. or lower.

Although FIGS. 3 and 5 schematically illustrate the device base 40 in a simplified manner, each of the anode 42 and the cathode 44 can be configured such that a portion of each of the anode 42 and the cathode 44 can be pulled out of the sealing member 20 such that it is possible to apply a voltage to the anode 42 and the cathode 44.

Alternatively, electrode portions, which are provided so as to correspond to the anode 42 and the cathode 44, respectively and partially disposed outside the sealing member 20, may be formed on the substrate 41, and the anode 42 and the cathode 44 may be formed to be electrically connected to the corresponding electrode portions.

Through the sealing member bonding step S30, the organic EL device is formed for each device formation area. Accordingly, the method for producing the organic EL device may have an individualization step of individualizing the substrate 41, which has been subjected to sealing member bonding step S30, for each device formation area. In the individualization step, the substrate 41 is divided for each device formation area to obtain an organic EL device of a product size.

Since the dehydration step S22 is provided in the method for producing the organic EL device, it is possible to remove moisture of the sealing member 20 and bond the sealing member 20 to the device base 40. Thus, favorable sealing performance can be realized, and deterioration of the organic layer in the organic EL device caused by moisture can be suppressed.

Since moisture in the protective film-bearing sealing member 10 is directly heated using the infrared ray in the dehydration step S22, it is possible to efficiently perform heating and dehydration. Furthermore, it is easy to perform the dehydration step S22 while conveying the protective film-bearing sealing member 10 by utilizing the infrared ray. Accordingly, it is possible to shorten the time required for the dehydration step S22, and as a result, the productivity of the organic EL device can be improved.

Meanwhile, moisture is released from the protective film-bearing sealing member 10 into the heating chamber 52 since the protective film-bearing sealing member 10 is heated and dehydrated in the dehydration step S22. The inventors of the present invention have found out that a dew point in the heating chamber 52 deteriorates as compared with an initially assumed dew point due to such released moisture so that there is a risk that it is difficult to dehydrate the protective film-bearing sealing member 10 to a desired moisture content.

The deterioration of the dew point will be described with a specific numerical value. It is assumed that the sealing base 21 does not contain moisture in the protective film-bearing sealing member 10. In this case, a volume of a moisture-containing portion of the protective film-bearing sealing member 10 corresponds to a sum of volumes of the protective film 30, the adhesive layer 22, and the resin film 23. When a thickness of the protective film 30 is 12 μm, a thickness of the adhesive layer 22 is 30 μm, and a thickness of the resin film 23 is 38 μm, a thickness of the moisture-containing portion is 80 μm. Accordingly, assuming that a length of the protective film-bearing sealing member 10 is 25 m and a width thereof is 600 mm, the volume of the moisture-containing portion is $1.2 \times 10^{-3}$ m$^3$ (=25 m×80 μm×600 mm). Further, when a moisture content in the above-described moisture-containing portion is 0.3 mass %, a maximum amount of released moisture when the protective film-bearing sealing member 10 is heated and dehydrated is 3.6 g (=0.3 mass %×(1.2×10$^{-3}$) m$^3$×1000 kg/m$^3$). When it is assumed that the protective film-bearing sealing member containing the maximum amount of released moisture is heated and dehydrated in the heating chamber 52, which has a volume of 6 m$^3$ and is set to have an initial dew point of −70° C. (vapor density 0.0028 g/m$^3$), the dew point deteriorates to at least −24° C. (vapor density: 0.6 g/m$^3$).

Therefore, when the protective film-bearing sealing member 10 is heated and dehydrated while being conveyed in the heating chamber 52, for example, the dew point deteriorates on the downstream side in the conveyance direction. In this case, moisture is hardly released from the protective film-bearing sealing member 10 on the downstream side of the heating chamber 52, and as a result, there is a risk that it is difficult to realize dehydration up to a desired moisture content.

On the other hand, in the dehydration step S22 of the method for producing the organic EL device according to the present embodiment, the atmosphere gas G1 having the dew point of −40° C. or lower is introduced from the downstream side to flow toward the upstream side in the conveyance direction of the protective film-bearing sealing member 10. If dehydration is performed while conveying the protective film-bearing sealing member 10, moisture is released as the protective film-bearing sealing member 10 is conveyed so that a moisture content of the protective film-bearing sealing member 10 is lower on the downstream side. Thus, if the atmosphere gas G1 having the dew point of −40° C. or lower is introduced from the downstream side, the atmosphere gas G1 which is not affected by the released moisture flows around the protective film-bearing sealing member 10 having a low moisture content. Furthermore, the moisture released from the protective film-bearing sealing member 10 flows to the upstream side and is discharged along with the flow of the atmosphere gas G1. As a result, it is possible to dehydrate the protective film-bearing sealing member 10 while reducing the influence of the moisture released from the protective film-bearing sealing member 10, and thus, the protective film-bearing sealing member 10 having a desired moisture content can be efficiently obtained in the dehydration step S22.

Since the atmosphere gas G1 having the dew point of −40° C. or lower is introduced from the downstream side to flow to the upstream side, it is possible to suppress the fluctuation of the dew point of the ambient atmosphere of the protective film-bearing sealing member and to maintain a constant dew point.

In one embodiment of the method for producing the organic EL device, the ambient atmosphere of the protective film-bearing sealing member 10 is adjusted to the dew point of −40° C. or lower between a start of the dehydration step S22 to an end of the sealing member bonding step S30. As a result, the deterioration of the moisture content of the protective film-bearing sealing member 10 dehydrated in the dehydration step S22 can be prevented, and the sealing member 20 with the moisture content dehydrated in the dehydration step S22 can be bonded to the device base 40. As a result, for example, entry of moisture from the sealing member 20 into the organic layer is suppressed, and favorable sealing performance can be realized in the organic EL device.

If the ambient atmosphere of the protective film-bearing sealing member 10 is adjusted to have the dew point of −40° C. or lower (preferably, the dew point of −70° C. or lower), for example, in the winding step S23, the deterioration of the moisture content of the protective film-bearing sealing member 10 can be prevented in the winding step S23. Even in the winding step S23, if the atmosphere gas G2 having the dew point of −40° C. or lower (preferably, the dew point of −70° C. or lower) is caused to flow from the downstream side to the upstream side in the conveyance direction of the protective film-bearing sealing member 10, it is easy to maintain the moisture content of the dehydrated protective film-bearing sealing member 10 that has been rolled up to a desired moisture content.

In the method for producing the organic EL device of the present embodiment, the protective film-bearing sealing member 10 is heated and dehydrated. In this case, there is a risk that an air bubble is generated due to the moisture released by heating of the protective film-bearing sealing member 10 since the protective film 30 is laminated on the adhesive layer 22. When the air bubble is generated, for example, deformation of the protective film-bearing sealing member 10, such as deformation of the sealing base 21 and peeling of the protective film 30, easily occur due to the air bubble.

On the other hand, the dehydration step S22 is performed under the pressure of 1000 Pa or more in the present embodiment. Under such a pressure, moisture is released without forming the above-described air bubble. Accordingly, it is possible to prevent the deformation of the protective film-bearing sealing member 10, such as the deformation of the sealing base 21 and the peeling of the protective film 30 from the adhesive layer 22, due to the air bubble in the dehydration step S22 in the method for producing the organic EL device. Since the deformation of the sealing base 21 in the dehydration step S22 is suppressed, the organic EL portion 43 is reliably sealed when the sealing member 20 is bonded to the device base 40, and favorable sealing performance can be realized. Since the peeling of the protective film 30 from the adhesive layer 22 in the dehydration step S22 can be prevented, the adhesive layer 22 does not adhere to the conveyance roller R. Thus, it is not necessary to stop the conveyance of the protective film-bearing sealing member 10, and the productivity of the organic EL device can be improved. An upper limit of the pressure in the heating chamber 52 in the dehydration step S22 may be a pressure at which moisture can be released from the protective film-bearing sealing member 10. For example, the upper limit of the pressure in the heating chamber 52 is lower than a saturated water vapor pressure at the surface temperature of the protective film-bearing sealing member 10.

Next, Experimental Example 1, Experimental Example 2, Experimental Example 3, Experimental Example 4, and Comparative Experimental Example 1 will be described. Components of the experimental example and the comparative experimental example corresponding to the components of the above description will be denoted by the same reference signs in order to omit the redundant description.

Experimental Example 1

In Example 1, the protective film-bearing sealing member 10 cut out to 10 cm square was prepared. The protective film-bearing sealing member 10 was provided with the sealing base 21, the adhesive layer 22, and the protective film 30. Specifically, the adhesive layer 22 was laminated on the sealing base 21, and the protective film 30 was further laminated on the adhesive layer 22.

The sealing base 21 was a copper foil having a thickness of 35 μm (CF-T8G-STD-35 produced by Fukuda Metal Foil & Powder Co., Ltd.). The adhesive layer 22 had a thickness of 30 μm. PET25TP01 produced by PANAC Co., Ltd. was used for the protective film 30, and a thickness of the protective film 30 was 25 μm.

The prepared protective film-bearing sealing member 10 was irradiated with infrared rays under an atmospheric pressure in a heating furnace (heating chamber), and the protective film-bearing sealing member 10 was heated and dehydrated at a temperature of 160° C. As a result, generation of an air bubble was not observed between the protective film 30 and the adhesive layer 22 during heating and dehydration.

Experimental Example 2

In Experimental Example 2, the same protective film-bearing sealing member 10 as in Experimental Example 1 was prepared. The protective film-bearing sealing member 10 was heated and dehydrated under the same conditions as in Experimental Example 1 except that the pressure in the heating furnace (heating chamber) was reduced to 1000 Pa. As a result, generation of an air bubble was not observed between the protective film 30 and the adhesive layer 22 during heating and dehydration.

Comparative Experimental Example 1

In Comparative Experimental Example 1, the same protective film-bearing sealing member 10 as in Experimental Example 1 was prepared. The protective film-bearing sealing member 10 was heated and dehydrated under the same conditions as in Experimental Example 1 except that the pressure in the heating furnace (heating chamber) was reduced to $1 \times 10^{-5}$ Pa. As a result, an air bubble was generated between the protective film 30 and the adhesive layer 22 during heating and dehydration.

It was possible to suppress the generation of the air bubble by heating and dehydrating the protective film-bearing sealing member 10 under the pressure of 1000 Pa or more based on the above-described experimental results of heating and dehydration (dehydration step) of the protective film-bearing sealing member 10 in Experimental Example 1, Experimental Example 2 and Comparative Experimental Example 1.

Experimental Example 3

In Example 3, the same protective film-bearing sealing member 10 as in Experimental Example 1 was heated and dehydrated under the same conditions as in Experimental Example 1. As a result, generation of an air bubble was not observed between the protective film 30 and the adhesive layer 22 during heating and dehydration similarly to Experimental Example 1.

In Experimental Example 3, the protective film-bearing sealing member 10 heated and dehydrated as described above was stored in the state of being allowed to stand for 1 hour under an atmosphere with a dew point of −70° C. Thereafter, the sealing member 20 (a laminated body of the sealing base 21 and the adhesive layer 22), obtained by peeling off the protective film 30, was bonded to the device base 40, and a light emission test was conducted. As a result, there were few dark spots (non-light-emitting portion), and favorable sealing performance was obtained. A configuration of the organic EL portion 43 included in the device base 40 used in Experimental Example 1 was the above-described configuration example (g).

Experimental Example 4

In Experimental Example 4, the same protective film-bearing sealing member 10 as in Experimental Example 1 was prepared. The protective film-bearing sealing member 10 was heated and dehydrated under the same conditions as in Experimental Example 2. As a result, generation of an air bubble was not observed between the protective film 30 and the adhesive layer 22 during heating and dehydration similarly to Experimental Example 2.

Even in Experimental Example 4, the protective film-bearing sealing member 10 heated and dehydrated as described above was stored in the state of being allowed to stand for 1 hour under an atmosphere with a dew point of −70° C. Thereafter, the same sealing member 20 as in Experimental Example 1, obtained by peeling off the protective film 30, was bonded to the device base 40, and a light emission test was conducted. As a result, there were few dark spots (non-light-emitting portion), and favorable sealing performance was obtained. A configuration of the device base 40 was the same as that of Experimental Example 1.

Various embodiments of the present invention have been described as above. However, the present invention is not limited to the various exemplified embodiments, but is illustrated by the claims, and equivalence of and any modifications within the scope of the claims are intended to be included therein.

Although the description has been given by exemplifying the case where the protective film-bearing sealing member has the strip shape, the protective film-bearing sealing member may have a sheet shape. Similarly, the device base (or the substrate provided in the device base) may also have a sheet shape.

As illustrated in FIG. 4, the air supply port and the exhaust port are not necessarily provided in each of the heating chamber to perform the dehydration step and the winding chamber to perform the winding step. For example, when the heating step and the winding step are performed in one processing chamber, an air supply port may be provided on a winding side of the processing chamber, and an exhaust port may be provided on an unwinding side of the processing chamber. The unwinding step may also be performed in the processing chamber.

The protective film-bearing sealing member preparation step including the unwinding step and the winding step has been described. However, the protective film-bearing sealing member preparation step does not necessarily include at least one of the unwinding step and the winding step.

Although the case where the protective film-bearing sealing member is heated and dehydrated by infrared rays has been described in the dehydration step S22 of the present embodiment, a method for dehydrating the protective film-bearing sealing member is not limited to the method using the infrared ray. For example, a method of dehydrating by bringing hot air in contact with the protective film-bearing sealing member may be performed.

The description has been given regarding the aspect in which the heated and dehydrated protective film-bearing sealing member was once wound in the winding chamber after the dehydration step. However, the sealing member bonding step may be performed consecutively after the dehydration step while continuously conveying the dehydrated protective film-bearing sealing member as it is. In this case, a conveyance path of the protective film-bearing sealing member from the dehydration step to the protective film-bearing sealing member may be set to have an atmosphere with a dew point of −40° C.

The organic EL device produced by the method for producing the organic EL device is not limited to an aspect in which light is emitted from the substrate side, and is also applicable to an organic EL device which emits light from a side opposite to the substrate. Although the aspect which the first electrode and the second electrode of the device base are the anode and the cathode has been described, the first electrode may be a cathode, and the second electrode may be an anode. The present invention is also applicable to organic electronic devices other than organic EL device, such as an organic solar cell, an organic photodetector, and an organic transistor.

REFERENCE SIGNS LIST 10 protective film-bearing sealing member
20 sealing member
21 sealing base
22 adhesive layer
23 resin film
30 protective film
40 device base
41 substrate
42 anode (first electrode)
43 organic EL portion (device functional portion)
44 cathode (second electrode)
52 heating chamber
53 winding chamber
56 infrared irradiation unit
G1, G2 atmosphere gas

The invention claimed is:

1. A method for producing an organic electronic device, comprising:
    a device base formation step of forming a device base in which a first electrode, a device functional portion including an organic layer, and a second electrode are sequentially provided on a substrate;
    a dehydration step of dehydrating a protective film-bearing sealing member under a pressure of 1000 Pa or more while conveying the protective film-bearing sealing member, in which a protective film is laminated via an adhesive layer on a sealing member, in which the adhesive layer is laminated on a sealing base; and
    a sealing member bonding step of peeling off the protective film from the protective film-bearing sealing member which has been subjected to the dehydration step and bonding the sealing member to the device base via the adhesive layer, wherein,
    in the dehydration step, an atmosphere gas having a dew point of −40° C. or lower is caused to flow from a downstream side to an upstream side in a conveyance direction of the protective film-bearing sealing member.

2. The method for producing an organic electronic device according to claim 1, wherein
    a dew point of ambient atmosphere of the protective film-bearing sealing member, which has been subjected to the dehydration step, between a start of the dehydration step and an end of the sealing member bonding step is −40° C. or lower.

3. The method for producing an organic electronic device according to claim 2, comprising
    a winding step of conveying the protective film-bearing sealing member toward a winding unit after the dehydration step and winding the protective film-bearing sealing member at the winding unit, wherein, in the winding step, an atmosphere gas having a dew point of −40° C. or lower is caused to flow from the downstream side to the upstream side in the conveyance direction of the protective film-bearing sealing member.

4. The method for producing an organic electronic device according to claim 3, wherein
in the dehydration step, the protective film-bearing sealing member is dehydrated in a heating chamber, and
in the winding step, the protective film-bearing sealing member is wound in a winding chamber with atmosphere having a dew point of −40° C. or lower, the winding chamber provided at a subsequent stage of the heating chamber.

5. The method for producing an organic electronic device according to claim 1, comprising
a winding step of conveying the protective film-bearing sealing member toward a winding unit after the dehydration step and winding the protective film-bearing sealing member at the winding unit, wherein,
in the winding step, an atmosphere gas having a dew point of −40° C. or lower is caused to flow from the downstream side to the upstream side in the conveyance direction of the protective film-bearing sealing member.

6. The method for producing an organic electronic device according to claim 5, wherein
in the dehydration step, the protective film-bearing sealing member is dehydrated in a heating chamber, and
in the winding step, the protective film-bearing sealing member is wound in a winding chamber with atmosphere having a dew point of −40° C. or lower, the winding chamber provided at a subsequent stage of the heating chamber.

* * * * *